United States Patent
Yang et al.

(10) Patent No.: US 11,531,278 B2
(45) Date of Patent: Dec. 20, 2022

(54) EUV LITHOGRAPHY SYSTEM AND METHOD FOR DECREASING DEBRIS IN EUV LITHOGRAPHY SYSTEM

(71) Applicant: Taiwan Semiconductor Manufacturing Company, Ltd., Hsinchu (TW)

(72) Inventors: Chi Yang, Tainan (TW); Ssu-Yu Chen, New Taipei (TW); Shang-Chieh Chien, New Taipei (TW); Chieh Hsieh, Taoyuan (TW); Tzung-Chi Fu, Miaoli (TW); Bo-Tsun Liu, Taipei (TW); Li-Jui Chen, Hsinchu (TW); Po-Chung Cheng, Zhongpu Township, Chiayi County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/205,397

(22) Filed: Mar. 18, 2021

(65) Prior Publication Data

US 2021/0223708 A1 Jul. 22, 2021

Related U.S. Application Data

(60) Continuation of application No. 16/927,142, filed on Jul. 13, 2020, now Pat. No. 10,955,762, which is a
(Continued)

(51) Int. Cl.
*G03F 7/20* (2006.01)
*H05G 2/00* (2006.01)

(52) U.S. Cl.
CPC ...... *G03F 7/70916* (2013.01); *G03F 7/70033* (2013.01); *G03F 7/70533* (2013.01); *G03F 7/70933* (2013.01); *H05G 2/005* (2013.01)

(58) Field of Classification Search
CPC .............. G03F 7/70916; G03F 7/70033; G03F 7/70533; G03F 7/70933; G03F 7/70166;
(Continued)

(56) References Cited

U.S. PATENT DOCUMENTS

| 8,764,995 B2 | 7/2014 | Chang et al. |
| 8,796,666 B1 | 8/2014 | Huang et al. |

(Continued)

FOREIGN PATENT DOCUMENTS

| CN | 101785369 A | 7/2010 |
| CN | 103064259 A | 4/2013 |

(Continued)

*Primary Examiner* — Christina A Riddle
(74) *Attorney, Agent, or Firm* — Birch, Stewart, Kolasch & Birch, LLP

(57) ABSTRACT

Extreme ultraviolet (EUV) lithography systems are provided. A EUV scanner is configured to perform a lithography exposure process in response to EUV radiation. A light source is configured to provide the EUV radiation to the EUV scanner. A measuring device is configured to measure concentration of debris caused by unstable target droplets in the chamber. A controller is configured to adjust a first gas flow rate and a second gas flow rate in response to the measured concentration of the debris and a control signal from the EUV scanner. A exhaust device is configured to extract the debris out of the chamber according to the first gas flow rate. A gas supply device is configured to provide a gas into the chamber according to the second gas flow rate. The control signal indicates the lithography exposure process is completed.

20 Claims, 4 Drawing Sheets

Related U.S. Application Data continuation of application No. 16/675,921, filed on Nov. 6, 2019, now Pat. No. 10,712,676, which is a division of application No. 16/021,461, filed on Jun. 28, 2018, now Pat. No. 10,495,987.

(60) Provisional application No. 62/564,557, filed on Sep. 28, 2017.

(58) Field of Classification Search
CPC ......... G03F 7/70925; G03F 7/70–7005; G03F 7/708; G03F 7/70808; G03F 7/7085; G03F 7/70858; G03F 7/70883; G03F 7/70891; G03F 7/70908–70941; G03F 7/70983; G03F 7/70991; H05G 2/00–008
USPC ............ 355/30, 52–55, 67–71, 77; 359/509; 250/492.1, 492.2, 492.22, 492.23, 493.1, 250/503.1, 504 r, 505.1
See application file for complete search history.

(56) References Cited

U.S. PATENT DOCUMENTS

| | | | |
|---|---|---|---|
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 10,495,987 B2 * | 12/2019 | Yang | H05G 2/005 |
| 10,712,676 B2 * | 7/2020 | Yang | G03F 7/70033 |
| 10,955,762 B2 * | 3/2021 | Yang | H05G 2/005 |
| 2001/0048084 A1 * | 12/2001 | Uzawa | G03F 7/70933 250/492.22 |
| 2002/0083957 A1 | 7/2002 | Reid | |
| 2004/0105080 A1 | 6/2004 | Teunissen et al. | |
| 2005/0122498 A1 | 6/2005 | Jasper | |
| 2007/0145297 A1 * | 6/2007 | Freriks | B82Y 10/00 250/492.2 |
| 2009/0057567 A1 * | 3/2009 | Bykanov | H05G 2/005 250/429 |
| 2009/0154642 A1 * | 6/2009 | Bykanov | H05G 2/003 378/34 |
| 2010/0192973 A1 * | 8/2010 | Ueno | G02B 19/0052 134/1.1 |
| 2011/0204249 A1 | 8/2011 | Nagai et al. | |
| 2013/0319466 A1 | 12/2013 | Mizoguchi et al. | |
| 2016/0143122 A1 * | 5/2016 | Heo | H05G 2/005 239/524 |
| 2016/0209753 A1 * | 7/2016 | Zhao | G03F 7/70916 |
| 2016/0278196 A1 | 9/2016 | Beijsens et al. | |
| 2016/0320708 A1 | 11/2016 | Lu et al. | |
| 2017/0215265 A1 | 7/2017 | Baek et al. | |
| 2017/0277040 A1 | 9/2017 | Lu et al. | |

FOREIGN PATENT DOCUMENTS

| | | | | |
|---|---|---|---|---|
| TW | 200612208 A | 4/2006 | | |
| TW | 201319763 A1 | 5/2013 | | |
| WO | WO-2015086510 A1 * | 6/2015 | ......... | G03F 7/70916 |
| WO | WO-2016037786 A1 * | 3/2016 | ............ | H05G 2/001 |

* cited by examiner

EUV LITHOGRAPHY SYSTEM AND METHOD FOR DECREASING DEBRIS IN EUV LITHOGRAPHY SYSTEM

CROSS REFERENCE TO RELATED APPLICATIONS

This application is a Continuation of application Ser. No. 16/927,142, filed on Jul. 13, 2020, now U.S. Pat. No. 10,955,762, which is a Continuation of application Ser. No. 16/675,921, filed on Nov. 6, 2019, now U.S. Pat. No. 10,712,676, which is a Divisional of application Ser. No. 16/021,461, filed on Jun. 28, 2018, now U.S. Pat. No. 10,495,987, which claims the priority of U.S. Provisional Application No. 62/564,557, filed on Sep. 28, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Extreme ultraviolet lithography (EUVL) has been developed to perform high-resolution photolithography in semiconductor manufacturing. The EUVL employs scanners using light in the extreme ultraviolet (EUV) region, having a wavelength of about 1-100 nm. Some EUV scanners provide 4×reduction projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak maximum emission at 13.5 nm. The EUV light is then collected by a LPP collector and reflected by optics towards a lithography target, e.g., a wafer. The collector is subjected to damage and degradation due to the impact of particles, ions, radiation, and most seriously, tin deposition.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
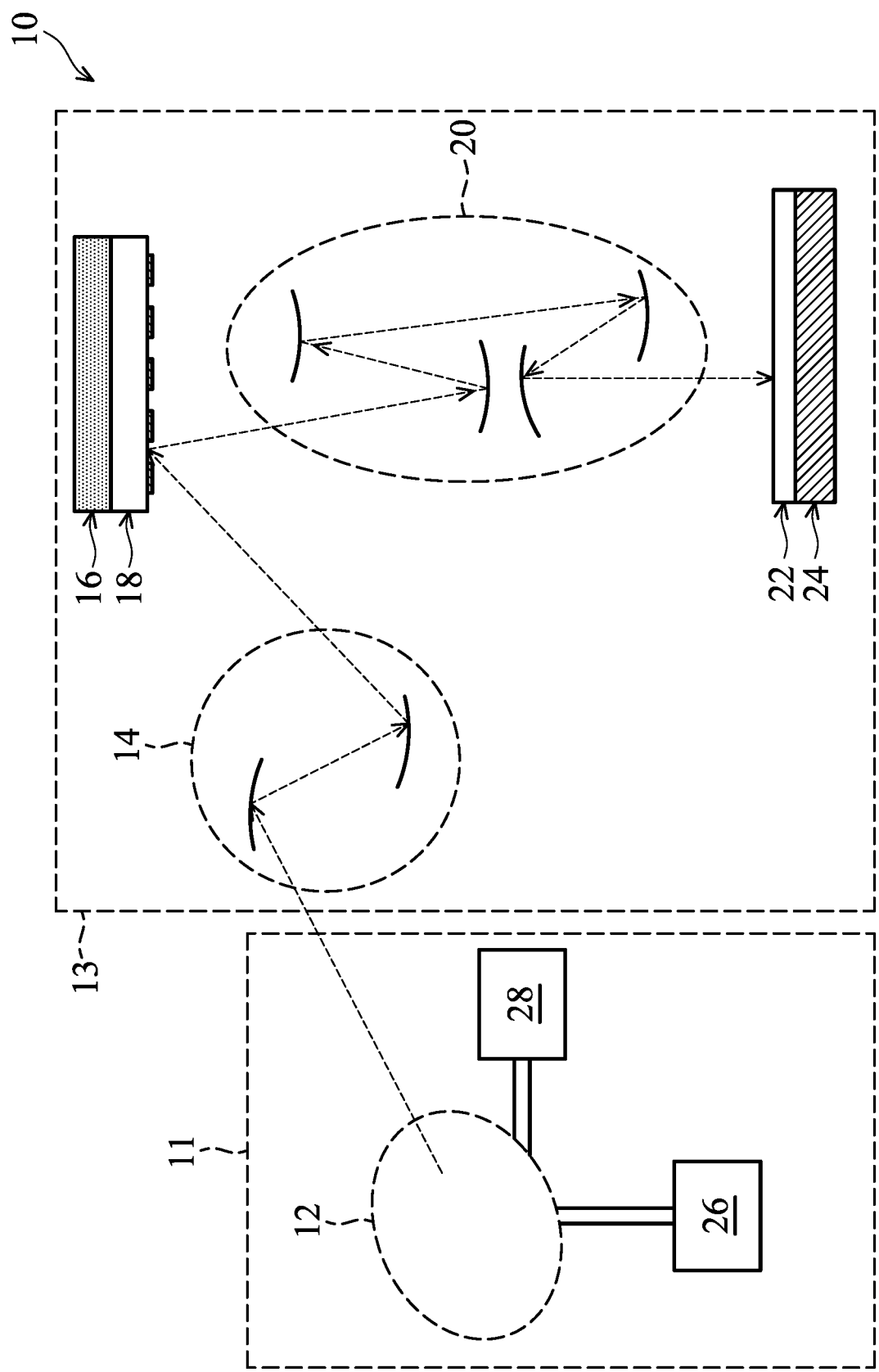
FIG. 1 shows a schematic and diagrammatic view of a lithography system, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 shows a schematic and diagrammatic view of a lithography system 10, in accordance with some embodiments of the disclosure. The lithography system 10 is operable to perform lithography exposure processes with respective radiation source and exposure mode.

The lithography system 10 may include a light source 12, an illuminator 14, a mask stage 16, a projection optics module (or projection optics box (POB)) 20, a substrate stage 24, one or more gas supply modules 26, and one or more exhaust modules 28 as shown in FIG. 1. In some embodiments, the light source 12, the gas supply module 26 and the exhaust module 28 are implemented in an extreme ultraviolet (EUV) radiation source apparatus 11. Furthermore, the illuminator 14, the mask stage 16, the projection optics module 20 and the substrate stage 24 are implemented in an EUV scanner 13 in certain embodiments. The elements of the lithography system 10 can be added to or omitted, and the invention should not be limited by the embodiments of the present disclosure.

The light source 12 is configured to generate radiation having a wavelength ranging between about 1 nm and about 100 nm. In some embodiments, the light source 12 is capable of generating an EUV radiation (or light) with a wavelength centered at about 13.5 nm. In such embodiments, the light source 12 is also referred to as an EUV light source. In some embodiments, the light source 12 can be utilized to perform any high-intensity photon emission from excited target material.

The illuminator 14 may include various refractive optic components, such as a single lens or a lens system having multiple lenses (zone plates) or alternatively reflective optics (for EUV lithography system), such as a single mirror or a mirror system having multiple mirrors in order to direct light from the light source 12 onto the mask stage 16, particularly to a mask 18 secured on the mask stage 16 in certain embodiments. In such embodiments, the light source 12 generates light in the EUV wavelength range, and reflective optics is employed.

The mask stage 16 is configured to secure the mask 18. In some embodiments, the mask stage 16 includes an electrostatic chuck (e-chuck) to secure the mask 18. This is because the gas molecules absorb EUV light and the lithography system for the EUV lithography patterning is maintained in a vacuum environment to avoid EUV intensity loss. In such embodiments, the terms mask, photomask, and reticle are used interchangeably.

In some embodiments, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 may further include reflective multilayer deposited on the substrate.

The reflective multilayer includes a plurality of film pairs, such as molybdenum-silicon (Mo/Si) film pairs (e.g., a layer of molybdenum above or below a layer of silicon in each film pair) in certain embodiments. Alternatively, the reflective multilayer may include molybdenum-beryllium (Mo/Be) film pairs, or other suitable materials that are configurable to highly reflect the EUV light. The mask 18 may further include a capping layer, such as ruthenium (Ru), disposed on the reflective multilayer for protection. The mask 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming an EUV phase shift mask.

The projection optics module (or POB) 20 is configured to provide a patterned beam and project the patterned beam onto a semiconductor substrate 22, so as to image the pattern of the mask 18 on to the semiconductor substrate 22 secured on the substrate stage 24 of the lithography system 10. In some embodiments, the projection optics module 20 has refractive optics (such as for a UV lithography system) or alternatively reflective optics (such as for an EUV lithography system). The light directed from the mask 18, carrying the image of the pattern defined on the mask, is collected by the projection optics module 20. In some embodiments, the illuminator 14 and the projection optics module 20 are collectively referred to as an optical module of the lithography system 10.

In some embodiments, the semiconductor substrate 22 is a semiconductor wafer, and the semiconductor wafer may be made of silicon or other semiconductor materials. Alternatively or additionally, the semiconductor substrate 22 may include other elementary semiconductor materials such as germanium (Ge). In some embodiments, the semiconductor substrate 22 is made of a compound semiconductor such as silicon carbide (SiC), gallium arsenic (GaAs), indium arsenide (InAs), or indium phosphide (InP). In some embodiments, the semiconductor substrate 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor substrate 22 may be a silicon-on-insulator (SOI) or a germanium-on-insulator (GOI) substrate.

The semiconductor substrate 22 may have various device elements. Examples of device elements that are formed in the semiconductor substrate 22 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor substrate 22 is coated with a resist layer sensitive to the EUV light. Various components including those described above are integrated together and are operable to perform lithography exposure processes.

In some embodiments, the exhaust module 28 may be configured to exhaust the gas outside the light source 12 according to a first gas flow rate (e.g., the flow rate of the gas exhausted from the light source 12), so as to extract debris out of the light source 12. Furthermore, the gas supply module 26 may be configured to provide the gas (e.g., Hydrogen gas) to the light source 12 according to a second gas flow rate (e.g., the flow rate of the gas input to the light source 12), so as to decrease contamination of the light source 12. In some embodiments, the gas is $H_2$, He, Ar, N or another inert gas. The collaboration of the radiation source 12, the gas supply module 26, and the exhaust module 28 of the disclosed embodiments is further discussed below.

Figure 2:
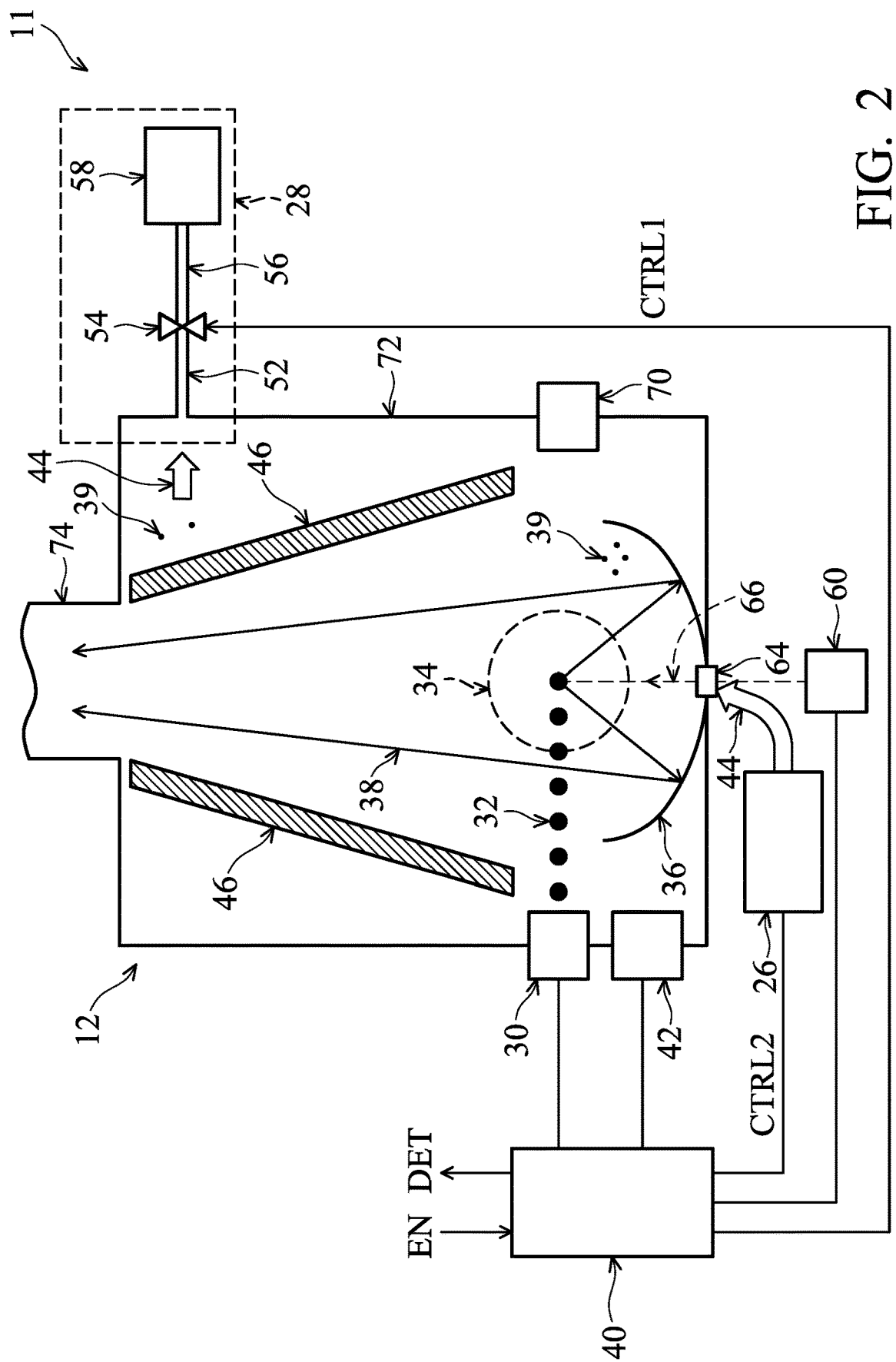
FIG. 2 shows the EUV radiation source apparatus of the lithography system of FIG. 1, in accordance with some embodiments of the disclosure.

FIG. 2 shows the EUV radiation source apparatus 11 of the lithography system 10 of FIG. 1, in accordance with some embodiments of the disclosure. The EUV radiation source apparatus 11 employs a single pulse laser produced plasma (LPP) mechanism to generate plasma and further generate EUV light 38 from the plasma.

The EUV radiation source apparatus 11 includes the light source 12. In some embodiments, the light source 12 includes a controller 40, a target droplet generator 30, a laser generator 60, a LPP collector 36, a measuring device 42, a debris collection device 46, a droplet catcher 70, and a source vessel (or chamber) 72. The above-mentioned elements of the light source 12 may be held under vacuum. Furthermore, the source vessel 72 is maintained in a vacuum environment. It should be appreciated that the elements of the light source 12 can be added to or omitted, and the invention should not be limited by the embodiments.

In certain embodiments, the controller 40 is coupled to the measuring device 42, the target droplet generator 30, and the laser generator 60. In such embodiments, the controller 40 is configured to control the operations of the measuring device 42, the target droplet generator 30, and the laser generator 60. Furthermore, the controller 40 may be configured to receive information measured by the measuring device 42. A detailed description of the measured information will be provided below.

The target droplet generator 30 is configured to generate a plurality of target droplets 32 into the source vessel 72. For example, the target droplets 32 are generated one at a time and a train of target droplets 32 move through the excitation zone 34. In some embodiments, the target droplet generator 30 includes a gas supplier (not shown). The gas supplier is configured to supply a pumping gas to force target material out of the target droplet generator 30 and drive the flowing of the target droplets 32. A flow velocity of the target droplets 32 from the target droplet generator 30 is a function of the pressure of the pumping gas in the target droplet generator 30. For example, the target droplets 32 flow faster when the pressure of the pumping gas is increased, and the target droplets 32 flow slower when the pressure of the pumping gas is decreased. Stated in another way, the flow velocity of the target droplets 32 from the target droplet generator 30 may be controlled by the controller 40.

In some embodiments, the target droplets 32 are tin (Sn) droplets. In some embodiments, the target droplets 32 have a diameter about 30 microns (μm). In some embodiments, the target droplets 32 are generated at a rate about 50 kilohertz (kHz) and are introduced into the excitation zone 34 in the light source 12 at a speed about 70 meters per second (m/s). Other material can also be used for the target droplets 32, for example, a tin containing liquid material such as eutectic alloy containing tin, lithium (Li), and xenon (Xe). The target droplets 32 may be in a solid or liquid phase.

The laser generator 60 is configured to generate a plurality of pulse lasers 66, to allow a conversion of the target droplets 32 into plasma. In such embodiments, the laser generator 60 includes a single laser source, and the laser source is configured to produce the pulse lasers (or laser beams) 66. Each pulse laser 66 is used to irradiate the target droplet 32, so as to generate increased emission of light. For example, the pulse laser 66 heats the target droplet 32 to a preset temperature. At the preset temperature, the material of the target droplets 32 shed their electrons and become a plasma that emits EUV light (or radiation) 38. The EUV light 38 is collected by the collector 36. The collector 36 further reflects and focuses the EUV light 38 for the lithography exposure processes. For example, the EUV light 38 collected by the collector 36 is irradiated to the illuminator 14 of FIG. 1 via an output port 74 of the source vessel 72, so as to direct the EUV light 38 from the light source 12 onto the mask stage 16, particularly to the mask 18 secured on the mask stage 16.

In such embodiments, the laser source is a carbon dioxide (CO2) laser source. In some embodiments, the laser source is a neodymium-doped yttrium aluminum garnet (Nd:YAG) laser source. In some embodiments, the pulse laser 66 has a specific spot size (e.g., about 100-300 μm). The pulse laser 66 is generated to have certain driving powers to fulfill wafer volume production, such as a throughput of 125 wafers per hour. For example, the pulse laser 66 is equipped with about 19 kW driving power. It should be appreciated that many variations and modifications can be made to embodiments of the disclosure.

The pulse laser 66 from the laser source is directed through a window (or lens) 64 of the collector 36, into the excitation zone 34, so as to irradiate the target droplet 32 in the excitation zone 34. The window 64 adopts a suitable material substantially transparent to the pulse lasers 66.

In some embodiments, the light source 12 may employ a dual LPP mechanism where the laser source 60 is a cluster of multiple laser sources. For example, the laser source 60 may include a pre-heat laser source and a main laser source, which produce pre-pulse lasers and main pulse lasers, respectively. Each of the pre-heat laser source and the main laser source may be a $CO_2$ laser source, an Nd:YAG laser source, or other suitable laser source. The pre-pulse laser has a smaller spot size and less intensity than the main pulse laser, and the pre-pulse laser is used for pre-heating the target droplet 32 to create a low-density target plume, which is subsequently reheated by the main pulse laser, generating increased emission of EUV light 38. Furthermore, the EUV light 38 is collected by the collector 36. The collector 36 further reflects and focuses the EUV light 38 for the lithography exposure processes.

The collector 36 is designed with the proper coating material and shape, functioning as a mirror for EUV collection, reflection, and focusing. In some embodiments, the collector 36 is designed to have an ellipsoidal geometry. In some embodiments, the coating material of the collector 36 is similar to the reflective multilayer of the EUV mask 18 of FIG. 1. In some embodiments, the coating material of the collector 36 includes a ML (such as a plurality of Mo/Si film pairs) and may further include a capping layer (such as Ru) coated on the ML to substantially reflect the EUV light. In some embodiments, the collector 36 may further include a grating structure designed to effectively scatter the laser beam directed onto the collector 36. For example, a silicon nitride layer may be coated on the collector 36 and patterned to have a grating structure.

The droplet catcher 70 is arranged opposite the target droplet generator 30 and in the direction of the movement of the target droplets 32. The droplet catcher 70 is configured to catch any target droplets 32 that are not hit by the pulse laser 66. For example, some target droplets 32 may be purposely missed by the pulse laser 66. Furthermore, the high-temperature plasma may cool down and become vapor or small particles (collectively, debris) 39. When the target droplets 32 are not properly and accurately irradiated by the pulse lasers 66, the debris (or dust) 39 is increased. For example, if the target droplets 32 are unstable, the unstable target droplets 32 are converted into unstable plasma and unexpected debris 39 is present, thereby increasing the debris 39. The debris 39 may be deposited onto the surface of the collector 36, thereby causing contamination thereof. Hence, the sedimentation occurs when the accumulated debris 39 overcomes the gravity. Over time, the reflectivity of the collector 36 degrades due to debris accumulation and other factors such as ion damage, oxidation, and blistering. Furthermore, the energy of the pulse lasers 66 is decreased due to unwanted absorption by the debris 39, thereby leading to more debris 39 generation and fast collector degradation. Once the reflectivity is degraded to a certain degree (e.g., less than 50%), the collector 36 reaches the end of its usable lifespan and needs to be swapped out in a replacement operation. When swapping out the collector 36 during the replacement operation, the lithography system 10 is shut down, and no lithography exposure process can be performed. When the number of the replacement operations or operation time of the replacement operations is increased, manufacturing cycle of the semiconductor substrate 22 is increased, thereby increasing manufacturing costs.

The measuring device 42 is configured to measure concentration of the debris 39 in the source vessel 72. In some embodiments, the measuring device 42 is a concentration detector capable of providing information regarding the concentration of the debris 39 to the controller 40.

Figure 3B:
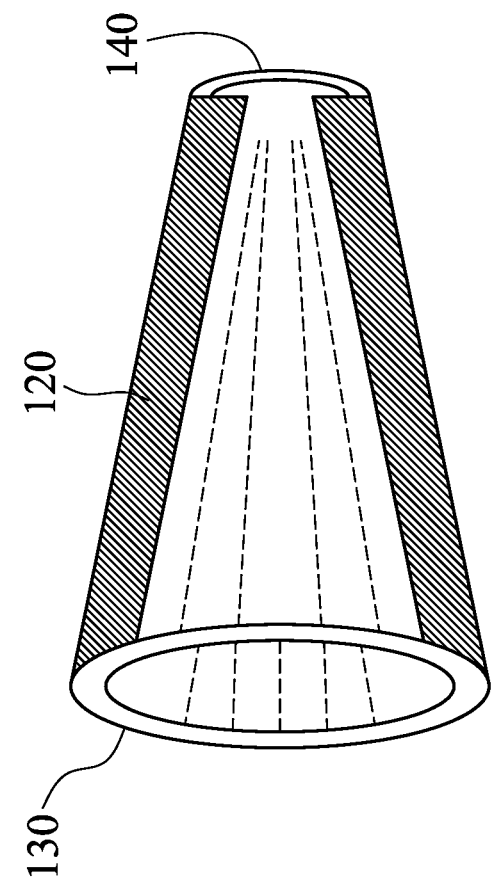
FIG. 3B shows a schematic side view of the debris collection device.
Figure 3A:
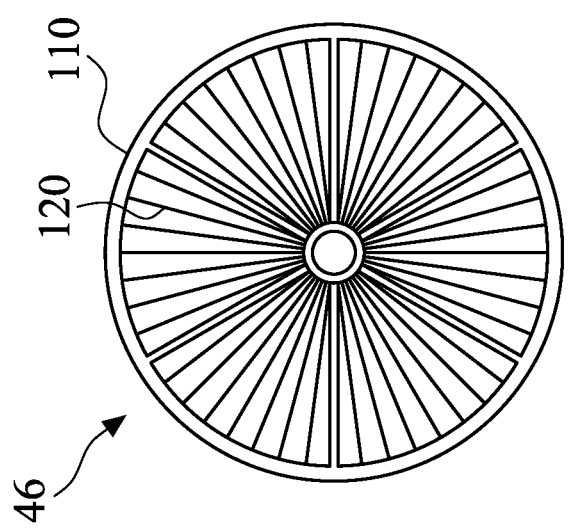
FIG. 3A shows a front view of the debris collection device.

The debris collection device 46 is disposed between the excitation zone 34 and the output port 74 in the source vessel 72. FIG. 3A shows a front view of the debris collection device 46, and FIG. 3B shows a schematic side view of the debris collection device 46. The debris collection device 46 includes a housing 110, a first end support 130 and a second end support 140 that operably support a plurality of vanes 120 that rotate within the housing 110. In some embodiments, the housing 110 is a frustoconical support frame. The first end support 130 has a larger diameter than the second end support 140. The debris collection device 46 serves to prevent the surface of collector 36 and/or other elements/portions of the inside the source vessel 72 from being coated by Sn vapor by sweeping out slow Sn atoms and/or $SnH_4$ using rotating vanes 120.

The vanes 120 project radially inward from the housing 110. The vanes 120 may be thin and elongated plates. In some embodiments, each of the vanes has a triangular or trapezoid or trapezium shape in plan view. In some embodiments, the vanes 120 are aligned so that their longitudinal axes are parallel to the direction of the pulse laser 66 (e.g., toward the output port 74 of the source vessel 72) so that they present the smallest possible cross-sectional area to the EUV radiation 38. In some embodiments, a central core of the debris collection device 46 is empty. The debris collection device 46 is driven to rotate by a drive unit (not shown) including one or more motors, one or more belts and/or one or more gears, or any rotating mechanism. The vanes 120 are heated at 100° C. to 400° C. by a heater in some embodiments.

The debris collection device 46 is made of suitable material such as stainless steel, Cu, Al or ceramics. In some embodiments, the debris collection device 46 is made of stainless steel. In such embodiments, the surface of the debris collection device 46, in particular the surface of vanes 120, is coated with a catalytic material that can reduce $SnH_4$ to Sn. The catalytic material includes ruthenium (Ru), tin (Sn), tin oxide, titanium oxide, or any combination thereof. In some embodiments, Ru is used. The Ru coated surface of the debris collection device 46 reduces $SnH_4$ to Sn, and traps Sn thereon.

Ruthenium may be coated on the surface of the vanes by a thermal deposition method, an e-beam deposition method or any other suitable film formation methods. The thickness of the Ru layer is in a range from about 2 nm to about 50 nm in some embodiments. Similar methods and configurations may be applied to catalytic layers including another material.

In some embodiments, the surface of vanes 120 has a roughened structure, and the catalytic layer is formed on the roughened surface. The roughened surface has nano-scale microstructures which are regularly and/or irregularly/randomly arranged.

Referring back to FIG. 2, the lithography system 10 further includes the gas supply module 26 and the exhaust module 28. The gas supply module 26 is configured to provide a gas 44 into the source vessel 72 according to the second gas flow rate and particularly into a space proximate the reflective surface of the collector 36. In such embodiments, the second gas flow rate of the gas 44 provided by the gas supply module 26 is adjustable according to a second control signal CTRL2 from the controller 40. For example, if the second control signal CTRL2 is a digital signal with one bit, the controller 40 provides the second control signal CTRL2 with a first logic level to increase the second gas flow rate, and provides the second control signal CTRL2 with a second logic level to decrease the second gas flow rate.

In some embodiment, the gas 44 is hydrogen gas (e.g., $H_2$), which has less absorption to the EUV radiation. The hydrogen gas is used as H radicals generated by ionization of the gas 44 can be used for cleaning purposes. In some embodiments, the gas is He, Ar, N or another inert gas. When the target droplets 32 contain tin, the gas 44 reaching to the coating surface of the collector 36 (and the window 64 as well) reacts chemically with tin to form stannane ($SnH_4$), a gaseous byproduct of the EUV generation process itself. Pumped out (e.g., by the exhaust module 28), stannane is then discarded. Other suitable gas may be alternatively or additionally used. IN some embodiments, the gas 44 may be introduced into the collector 36 through openings (or gaps) near the window 64 through one or more gas pipelines.

Hydrogen gas has low absorption to the EUV radiation. Hydrogen gas reaching to the coating surface of the collector 36 reacts chemically with a metal of the target droplets 32 forming a hydride, e.g., metal hydride. When tin (Sn) is used as the target droplet 32, stannane ($SnH_4$), which is a gaseous byproduct of the EUV generation process, is formed. The gaseous $SnH_4$ is then pumped out by the exhaust module 28. As described above, in order to trap the $SnH_4$ or other debris, the debris collection device 46 is employed in the source vessel 72.

The gas 44 is also capable of carrying the debris 39 out of the source vessel 72 and into one or more exhaust module 28. In the following discussion, the debris 39 includes such byproducts between the residues of the target droplets 32 and the gas 44.

The exhaust module 28 is configured to extract the debris 39 out of the source vessel 72 according to the first gas flow rate. In such embodiments, the exhaust module 28 includes a first exhaust line 52, a valve 54, a second exhaust line 56 and one or more pumps 58.

The first exhaust line 52 is connected to the source vessel 72 of the light source 12 for receiving the debris 39. For the exhaust module 28, the first exhaust line 52 is arranged at a suitable position in the source vessel 72, so as to get the remaining portion of the debris 39 out of the space defined by the collector 36 and the debris collection device 46. The first exhaust line 50 receives the debris 39 in the form of vapors or a small particles along with the gas 44.

The valve 54 is connected between the first exhaust line 52 and the second exhaust line 56. The valve 54 may be a butterfly valve, a regulator, or a similar device. The valve 54 is configured to control the first gas flow rate from the first exhaust line 52 to the second exhaust line 56 according to a first control signal CTRL1 from the controller 40. For example, if the first control signal CTRL1 is a digital signal with one bit, the controller 40 provides the first control signal CTRL1 with a first logic level to increase the first gas flow rate, and provides the first control signal CTRL1 with a second logic level to decrease the first gas flow rate. In some embodiments, the valve 54 is a butterfly valve, and an open ratio of the butterfly valve corresponding to the first gas flow rate is automatically adjusted according to the first control signal CTRL1.

The second exhaust line 56 is connected between the valve 54 and the pump 58. Furthermore, the pump 58 is configured to create airflow along a flow path from the source vessel 72 of the light source 12 into the first exhaust line 52, the valve 54 and the second exhaust line 56 in sequence, effectively pumping out the debris 39 from the source vessel 72. In such embodiments, the pump 58 is a vacuum pump controlled by the first control signal CTRL1. In some embodiments, the pump rate of the pump 58 is controlled by the first control signal CTRL1, and the first gas flow rate of the exhaust module 28 is determined according to the gas flow rate of the valve 54 and the pump rate of the pump 58.

In some embodiments, one or more filters (not shown) are arranged in the first exhaust line 52 and/or the second exhaust line 56. The filter is configured to remove at least a portion of debris 39 from the gas flowing in the flow path, thereby increasing the effectiveness of the exhaust module 28. In some embodiments, the filter is a debris trapping device (or debris trapper). For example, the debris trapper may include certain structure(s), such as labyrinth structures, nano rods, and porous macrostructures. When the debris 39 hits the structure, it condenses into liquid or solid form, thereby being trapped inside the debris trapper.

During a lithography exposure process, removal of gas from the source vessel 72 via the pump 58 is performed to maintain a constant gas pressure in the source vessel 72 in response to the gas 44 from the gas supply modules 26, and/or to remove contaminants, vapor, metal dust, etc. from the source vessel 72.

In the EUV radiation source apparatus 11, according to the concentration of the debris 39 from the measuring device 42, the controller 40 is capable of providing the second control signal CTRL2 and the first control signal CTRL1 to the gas supply module 26 and the exhaust module 28, respectively, so as to control the second gas flow rate of the gas supply module 26 and the first gas flow rate of the exhaust module 28 for a purge operation (or procedure) of the debris 39. In some embodiments, the first gas flow rate is proportional to the second gas flow rate, e.g., the ratio of the second gas flow rate to the first gas flow rate is greater than or equal to one. For example, when the concentration of the debris 39 exceeds an upper threshold value TH_H after the lithography exposure process is completed, the controller 40 is configured to increase the second gas flow rate of the gas supply module 26 and the first gas flow rate of the exhaust module 28 until the concentration of the debris 39 is less than a lower threshold value TH_L. Thus, vessel cleanness can be performed fast, thereby reducing contamination on the surface of the collector 36 and extending the usable lifespan of the collector 36. The lower threshold value TH_L (e.g., 0.001 µg/m$^3$) is less than the upper threshold value TH_H (e.g., 1 µg/m$^3$), i.e., TH_H>TH_L. A buffer range between the lower threshold value TH_L and the upper threshold value TH_H may avoid frequently enabling and disabling the purge operation. A detailed description of the purge operation will be provided below. Furthermore, the lower threshold value TH_L and the upper threshold value TH_H are determined according to various lithography exposure processes.

In some embodiments, the upper threshold value TH_H may be the same as the lower threshold value TH_L. Thus, the purge operation is performed intensively.

In some embodiments, the controller 40 further provides a control signal DET to the EUV scanner 13 of FIG. 1, so as to notify the EUV scanner 13 that the concentration of the debris 39 exceeds the upper threshold value TH_H. For example, if the control signal DET is a digital signal with one bit, the controller 40 provides the control signal DET with a first logic level to the EUV scanner 13 when the concentration of the debris 39 exceeds the upper threshold value TH_H. If a lithography exposure process is being performed by the EUV scanner 13, in response to the control signal DET, the EUV scanner 13 will provide a control signal EN to the controller 40 after the lithography exposure process is completed, so as to enable a purge operation in the source vessel 72. Next, in response to the control signal EN from the EUV scanner 13, the controller 40 is configured to increase the second gas flow rate of the gas supply module 26 and the first gas flow rate of the exhaust module 28 until the concentration of the debris 39 is less than the lower threshold value TH_L. Next, the controller 40 further provides the control signal DET to the EUV scanner 13, so as to notify the EUV scanner 13 that the concentration of the debris 39 is less than the lower threshold value TH_L. For example, if the control signal DET is a digital signal with one bit, the controller 40 provides the control signal DET with a second logic level to the EUV scanner 13 when the concentration of the debris 39 is less than the lower threshold value TH_L. Therefore, the EUV scanner 13 can execute the next lithography exposure process. In some embodiments, when the purge operation is performed, no semiconductor substrate 22 or the mask 18 is secured in the lithography system 10.

Figure 4:
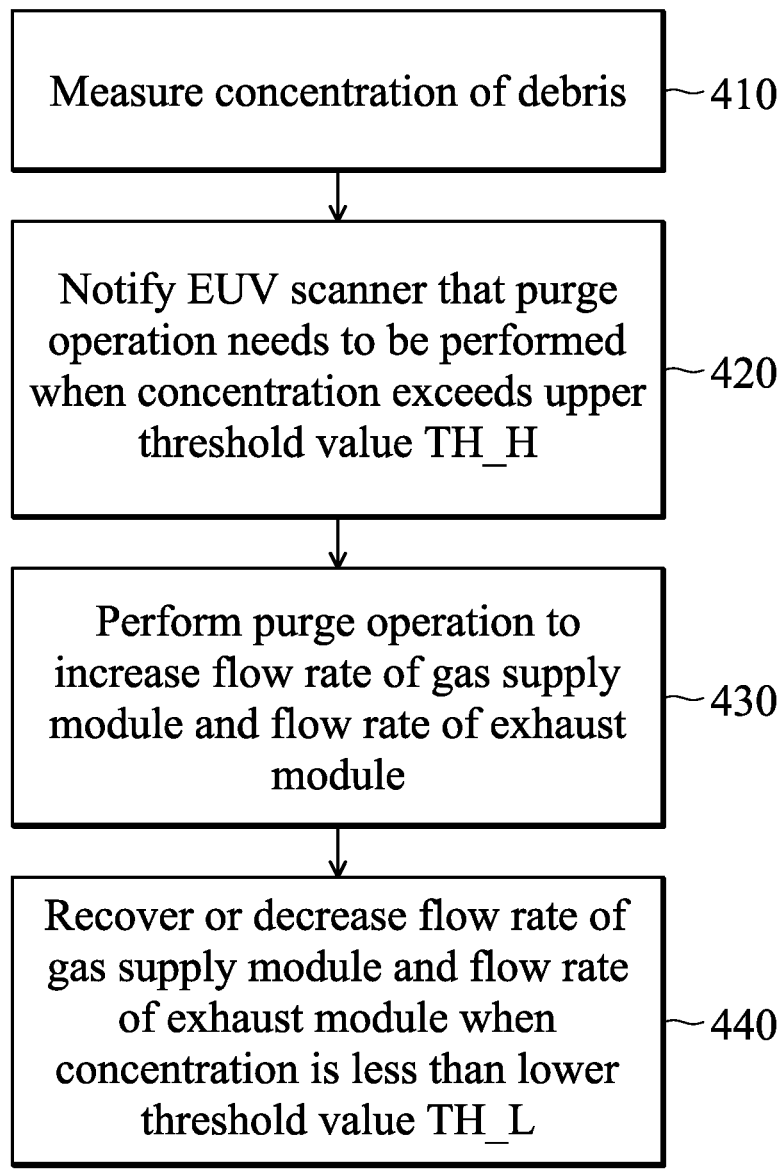
FIG. 4 shows a simplified flowchart of a method for decreasing debris, in accordance with some embodiments of the disclosure.

FIG. 4 shows a simplified flowchart of a method for decreasing debris, in accordance with some embodiments of the disclosure. Furthermore, the method of FIG. 4 is performed by the lithography system 10 of FIG. 1 for a lithography exposure process.

Before the method of FIG. 4 is performed, the EUV mask 18 and the semiconductor substrate 22 are loaded to the lithography system 10, and an EUV lithography exposure process is performing on the semiconductor substrate 22. The mask 18 is a patterning mask and includes an IC pattern to be transferred to the semiconductor substrate 22. Furthermore, the mask 18 is secured on the mask stage 16 and an alignment of the mask 18 is performed. The semiconductor substrate 22 is coated with a resist layer. In such embodiments, the resist layer is sensitive to the EUV light (radiation) from the light source 12 of the lithography system 10.

The lithography exposure process is performed by the EUV scanner 13 according to the EUV radiation from the light source 12. As described above, the target droplets 32 from the target droplet generator 30 are irradiated by the pulse lasers 66 in the source vessel 72, so as to convert the target droplets 32 into plasma as the EUV radiation 38. When the lithography exposure process is performing, the number of the debris 39 is increased.

In the lithography exposure process, the gas supply module 26 is configured to provide the gas 44 into the source vessel 72 according to the second gas flow rate with a low flow setting value FR_IN_L. Simultaneously, the exhaust module 28 is configured to extract the gas 44 with the debris 39 out of the source vessel 72 according to the first gas flow rate with a low flow setting value FR_OUT_L. The low flow setting value FR_IN_L may be equal to or different from the low flow setting value FR_OUT_L. In some embodiments, the first gas flow rate of the exhaust module 28 is equal to the second gas flow rate of the gas supply module 26. In some embodiments, the first gas flow rate of the exhaust module 28 is synchronized with (or proportional to) the second gas flow rate of the gas supply module 26. For example, when the first gas flow rate is increased, the second gas flow rate is increased, and when the first gas flow rate is decreased, the second gas flow rate is decreased.

In operation 410 of FIG. 4, the concentration of the debris 39 within the source vessel 72 is measured by the measuring device 42 and information regarding the concentration is provided to the controller 40. In some embodiments, the information regarding the concentration is transmitted through an analog signal or a digital signal with one or multiple bits. When obtaining the information regarding the concentration, the controller 40 compares the concentration with an upper threshold value TH_H to determine whether to perform a purge operation.

In some embodiments, the information regarding the concentration is further provided to the EUV scanner 13. According to the concentration, the EUV scanner 13 is capable of determining whether to perform a purge operation.

In operation 420, the controller 40 provides the control signal DET (e.g., with the first logic level) to the EUV scanner 13 when the concentration exceeds the upper threshold value TH_H, so as to notify the EUV scanner 13 that a purge operation needs to be performed for the light source 12.

When the control signal DET is obtained by the EUV scanner 13 and the lithography exposure process is still performing, the EUV scanner 13 will provide the control signal EN to the controller 40 after the lithography exposure process is completed. Conversely, when the control signal DET is obtained by the EUV scanner 13 and the lithography exposure process has been completed, the EUV scanner 13 is configured to immediately provide the control signal EN to the controller 40.

In some embodiments, the mask 18 and/or the semiconductor substrate 22 are unloaded from the EUV scanner 13 before the EUV scanner 13 provides the control signal EN to the controller 40. Thus, in the purge operation, no mask 18 or semiconductor substrate 22 is present in the lithography system 10.

In operation 430, in response to the control signal EN from the EUV scanner 13, the controller 40 is configured to increase the second gas flow rate of the gas supply module 26 and the first gas flow rate of the exhaust module 28, so as to perform the purge operation to quickly extract the debris 39 out of the source vessel 72.

In some embodiments, the controller 40 is configured to provide the second control signal CTRL2 to the gas supply module 26, so as to change the second gas flow rate of the gas supply module 26 from a low flow setting value FR_IN_L to a high flow setting value FR_IN_H, where the high flow setting value FR_IN_H is greater than the low flow setting value FR_IN_L (e.g., FR_IN_H>FR_IN_L). Thus, the gas 44 is quickly provided to the source vessel 72. Moreover, the controller 40 is also configured to provide the first control signal CTRL1 to the exhaust module 28, so as to change the first gas flow rate from a low flow setting value FR_OUT_L to a high flow setting value FR_OUT_H, where the high flow setting value FR_OUT_H is greater than the low flow setting value FR_OUT_L (e.g., FR_OUT_H>FR_OUT_L). Thus, the debris 39 is quickly extracted out of the source vessel 72.

In some embodiments, the second gas flow rate of the gas supply module 26 is gradually increased from the low flow setting value FR_IN_L to the high flow setting value FR_IN_H, and the first gas flow rate of the exhaust module 28 is gradually increased from the low flow setting value FR_OUT_L to the high flow setting value FR_OUT_H. In some embodiments, the second gas flow rate of the gas supply module 26 and the first gas flow rate of the exhaust module 28 are increased according to specific functions or equations of the concentration.

The low flow setting values FR_OUT_L and FR_IN_L and the high flow setting values FR_OUT_H and FR_IN_H are determined according to various lithography exposure processes.

In some embodiments, a debris density corresponding to the concentration is obtained according to the following equation (1):

$$\frac{dc}{dt} = S_d - p \times c, \tag{1}$$

wherein "$S_d$" represents the source of the debris generation, "p" represents the first gas flow rate of the exhaust module 28, and "c" represents the concentration of the debris 39.

In the purge operation, the controller 40 is configured to control the laser generator 60 to stop providing the pulse lasers 66. In some embodiments, the controller 40 is configured to control the target droplet generator 30 to stop providing the target droplets 32 in the purge operation. Therefore, no target droplet 32 is irradiated by the pulse laser 66, and no additional debris 39 is generated. Thus, the source of the debris generation is zero (i.e., $S_d$=0). Therefore, the debris density corresponding to the concentration is obtained according to the following equation (2):

$$\frac{dc}{dt} = 0 - p \times c. \tag{2}$$

Compared to the traditional operation that uses a fixed gas flow rate (e.g., p=FR_OUT_L) to extract the debris 39 out of the source vessel 72, the purge operation of the embodiments that uses an adjustable gas flow rate (e.g., p=FR_OUT_L in the lithography exposure process, and p=FR_OUT_H in the purge operation) can accelerate the extraction of the debris 39.

In the purge operation, the measuring device 42 is configured to continuously measure the concentration and to provide the concentration to the controller 40. After obtaining the concentration from the measuring device 42, the controller 40 compares the concentration with a lower threshold value TH_L to determine whether to finish the purge operation. Once the concentration is less than the lower threshold value TH_L, the purge operation is finished.

In operation 440, after determining that the concentration is less than the lower threshold value TH_L, the controller 40 is configured to recover or decrease the second gas flow rate of the gas supply module 26 and the first gas flow rate of the exhaust module 28. Simultaneously, the controller 40 is configured to provide the control signal DET (e.g., with the second logic level) to the EUV scanner 13, so as to notify the EUV scanner 13 that the light source 12 is clean. Thus, the next lithography exposure process can be performed.

In some embodiments, after the purge operation is completed, the controller 40 is configured to provide the second control signal CTRL2 (e.g., with the second logic level) to the gas supply module 26, so as to change the second gas flow rate from a high flow setting value FR_IN_H to a low flow setting value FR_IN_L. Thus, the gas 44 is provided to the source vessel 72 slowly. Moreover, the controller 40 is also configured to provide the first control signal CTRL1 (e.g., with the second logic level) to the exhaust module 28, so as to change the first gas flow rate from a high flow setting value FR_OUT_H to a low flow setting value FR_OUT_L. Thus, the debris 39 is extracted out of the source vessel 72 slowly.

In some embodiments, the second gas flow rate of the gas supply module 26 is gradually decreased from the high flow setting value FR_IN_H to the low flow setting value FR_IN_L, and the first gas flow rate of the exhaust module 28 is gradually decreased from the high flow setting value FR_OUT_H to the low flow setting value FR_OUT_L. In some embodiments, the second gas flow rate of the gas supply module 26 and the first gas flow rate of the exhaust module 28 are decreased according to specific functions or equations of the concentration.

Embodiments for radiation source apparatus, EUV lithography system, and method for decreasing debris in EUV lithography system are provided. The measuring device 42 is configured to measure the concentration of the debris 39 in the source vessel 72. If the concentration of the debris 39 exceeds an upper threshold value TH_H, the controller 40 is configured to provide the control signal DET to notify the EUV scanner 13 for the execution of the purge operation. Once the lithography exposure process being performed by the EUV scanner 13 is completed, the EUV scanner 13 is configured to provide the control signal EN to the controller 40, so as to start the purge operation. In the purge operation, the controller 40 is configured to increase the second gas flow rate of the gas supply module 26 and the first gas flow rate of the exhaust module 28 until the concentration of the debris 39 is less than the lower threshold value TH_L. In the purge operation, the controller 40 is also configured to control the target droplet generator 30 and the laser generator 60, so as to stop providing the target droplets 32 and the pulse lasers 66. When the concentration of the debris 39 does not exceed the lower threshold value TH_L, the purge operation is finished, and the controller 40 is configured to provide the control signal DET to notify the EUV scanner 13 for the next lithography exposure process. Thus, the debris 39 can be quickly extracted out of the source vessel 72, thereby contamination on the surface of the collector 36 is decreased. Therefore, the lifespan of the collector 36 is improved and then extended further. Also, the number of times that the collector 36 needs to be swapped is decreased. Furthermore, dose control and exposure quality can be secured due to more stable droplet conditions in the lithography exposure processes. Therefore, tool availability, productivity and reliability are also improved in the lithography exposure processes.

In some embodiments, an extreme ultraviolet (EUV) lithography system is provided. The EUV lithography system includes an EUV scanner, a light source, an exhaust device and a gas supply device. The EUV scanner is configured to perform a lithography exposure process in response to EUV radiation. The light source is configured to provide the EUV radiation to the EUV scanner. The light source includes a chamber, a measuring device and a controller. The measuring device is configured to measure concentration of debris caused by unstable target droplets in the chamber. The controller is configured to adjust a first gas flow rate and a second gas flow rate in response to the measured concentration of the debris and a control signal from the EUV scanner. The exhaust device is configured to extract the debris out of the chamber according to the first gas flow rate. The gas supply device is configured to provide a gas into the chamber according to the second gas flow rate. The control signal indicates the lithography exposure process is completed. The first gas flow rate is proportional to the second gas flow rate.

In some embodiments, an extreme ultraviolet (EUV) lithography system is provided. The EUV lithography system includes an EUV scanner, a light source, an exhaust device and a gas supply device. The EUV scanner is configured to perform a lithography exposure process in response to EUV radiation. The light source includes a chamber, a collector, a measuring device and a debris collection device disposed in the chamber. The collector is configured to collect the EUV radiation and direct the EUV radiation to the EUV scanner. The measuring device is configured to measure concentration of debris generated during the lithography exposure process in the chamber. The exhaust device is configured to extract the debris out the light source according to a first gas flow rate corresponding to the measured concentration of the debris. The gas supply device is configured to provide a gas into the light source according to a second gas flow rate corresponding to the measured concentration of the debris.

In some embodiments, a method for decreasing debris in a an extreme ultraviolet (EUV) lithography system is provided. Concentration of the debris is measured in a chamber of a light source. The debris is extracted out of the chamber according to a first gas flow rate of an exhaust device. A gas is provided into the chamber according to a second gas flow rate of a gas supply device. In response to the measured concentration of the debris, the first gas flow rate of the exhaust device and the second gas flow rate of the gas supply device are adjusted. In response to a first control signal, a purge operation is performed according to the adjusted first gas flow rate of the exhaust device and the adjusted second gas flow rate of the gas supply device. The first control signal indicates a lithography exposure process has been completed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) lithography system, comprising:
   an EUV scanner configured to perform a lithography exposure process in response to EUV radiation;
   a light source configured to provide the EUV radiation to the EUV scanner, wherein the light source comprises:
      a chamber;
      a concentration detector configured to measure concentration of debris caused by unstable target droplets in the chamber; and
      a controller configured to adjust a first gas flow rate and a second gas flow rate in response to the measured concentration of the debris and a control signal from the EUV scanner;
   an exhaust device configured to extract the debris out of the chamber according to the first gas flow rate; and
   a gas supply device configured to provide a gas into the chamber according to the second gas flow rate,
   wherein the control signal indicates the lithography exposure process is completed,
   wherein the first gas flow rate is proportional to the second gas flow rate, and a ratio of the second gas flow rate to the first gas flow rate is greater than one.

2. The EUV lithography system as claimed in claim 1, wherein the exhaust device comprises:
   a first exhaust line connected to the chamber;
   a valve connected to the first exhaust line, wherein the valve has an open ratio corresponding to the first gas flow rate;
   a second exhaust line connected to the valve; and a pump connected to the second exhaust line and configured to extract the debris out of the chamber and into the first exhaust line, the valve and the second exhaust line in sequence.

3. The EUV lithography system as claimed in claim 1, wherein when the measured concentration of the debris by the concentration detector exceeds an upper threshold value, the controller is configured to increase the first gas flow rate until the measured concentration of the debris is less than a lower threshold value.

4. The EUV lithography system as claimed in claim 1, wherein the light source further comprises:
a laser generator configured to provide a plurality of laser pulses to irradiate target droplets in the chamber during the lithography exposure process, so as to generate plasma as the EUV radiation, and configured to stop providing the laser pulses in response to the control signal.

5. The EUV lithography system as claimed in claim 1, wherein when the measured concentration of the debris exceeds an upper threshold value, the controller is configured to increase the first gas flow rate and the second gas flow rate of the gas supply device until the measured concentration of the debris is less than a lower threshold value.

6. The EUV lithography system as claimed in claim 1, wherein when the measured concentration of the debris exceeds an upper threshold value, the controller is configured to change the first gas flow rate from a first flow setting value to a second flow setting value, and when the measured concentration of the debris is less than a lower threshold value, the controller is configured to change the first gas flow rate from the second flow setting value to the first flow setting value, wherein the second flow setting value is greater than the first flow setting value.

7. The EUV lithography system as claimed in claim 6, further comprising:
a target droplet generator configured to provide a plurality of target droplets to the chamber; and
a laser generator configured to provide a plurality of laser pulses to irradiate the target droplets in the chamber when the first gas flow rate is changed to the low flow setting value.

8. An extreme ultraviolet (EUV) lithography system, comprising:
an EUV scanner configured to perform a lithography exposure process in response to EUV radiation;
a light source, comprising:
a chamber;
a collector configured to collect the EUV radiation and direct the EUV radiation to the EUV scanner;
a concentration detector configured to measure concentration of debris generated during the lithography exposure process in the chamber; and
a debris collection device disposed in the chamber;
an exhaust device configured to extract the debris out the light source according to a first gas flow rate corresponding to the measured concentration of the debris; and
a gas supply device configured to provide a gas into the collector of the light source according to a second gas flow rate corresponding to the measured concentration of the debris,
wherein a controller is configured to control a ratio of the second gas flow rate to the first gas flow rate to be greater than one.

9. The EUV lithography system as claimed in claim 8, wherein the light source further comprises:
a target droplet generator configured to provide a plurality of target droplets to the chamber; and
a laser generator configured to provide a plurality of laser pulses to irradiate the target droplets in the chamber through the window of the collector during the lithography exposure process, so as to generate plasma as the EUV radiation, and configured to stop providing the laser pulses when the lithography exposure process is completed.

10. The EUV lithography system as claimed in claim 8, wherein when the measured concentration of the debris exceeds an upper threshold value, the first gas flow rate is changed from a first flow setting value to a second flow setting value, and when the measured concentration of the debris is less than a lower threshold value, the first gas flow rate is changed from the second flow setting value to the first flow setting value, wherein the second flow setting value is greater than the first flow setting value.

11. The EUV lithography system as claimed in claim 8, wherein the debris collection device comprises:
a housing; and
a first end support and a second end support configured to support a plurality of vanes that rotate within the housing,
wherein the first end support has a larger diameter than the second end support.

12. The EUV lithography system as claimed in claim 8, wherein the EUV radiation is used to illuminate a patterning mask, so as to provide a patterned beam and project the patterned beam onto a semiconductor substrate in the lithography exposure process.

13. The EUV lithography system as claimed in claim 8, wherein the exhaust device comprises:
a first exhaust line connected to the chamber;
a valve connected to the first exhaust line, wherein the valve has an open ratio corresponding to the first gas flow rate;
a second exhaust line connected to the valve; and
a pump connected to the second exhaust line and configured to extract the debris out of the chamber and into the first exhaust line, the valve and the second exhaust line in sequence.

14. The EUV lithography system as claimed in claim 8, wherein when the measured concentration of the debris exceeds an upper threshold value and the lithography exposure process is completed, the first gas flow rate and the second gas flow rate are synchronically increased until the measured concentration of the debris is less than a lower threshold value.

15. The EUV lithography system as claimed in claim 8, wherein the first gas flow rate is proportional to the second gas flow rate of the gas supply device.

16. A method for decreasing debris in an extreme ultraviolet (EUV) lithography system, comprising:
measuring concentration of the debris in a chamber of a light source;
extracting the debris out of the chamber according to a first gas flow rate of an exhaust device;
providing a gas into the chamber according to a second gas flow rate of a gas supply device;
in response to the measured concentration of the debris, adjusting the first gas flow rate of the exhaust device and the second gas flow rate of the gas supply device; and in response to a first control signal, performing a purge operation according to the adjusted first gas flow rate of the exhaust device and the adjusted second gas flow rate of the gas supply device, wherein the first control signal indicates a lithography exposure process has been completed, wherein the adjusted first gas flow rate is proportional to the adjusted second gas flow rate, and a ratio of the adjusted second gas flow rate to the adjusted first gas flow rate is greater than one.

17. The method as claimed in claim 16, wherein in response to the measured concentration of the debris, adjusting the first gas flow rate of the exhaust device and the second gas flow rate of the gas supply device further comprises:

increasing the first gas flow rate of the exhaust device and the second gas flow rate of the gas supply device when the measured concentration of the debris exceeds an upper threshold value.

18. The method as claimed in claim 17, wherein in response to the measured concentration of the debris, adjusting the first gas flow rate of the exhaust device and the second gas flow rate of the gas supply device further comprises:

decreasing the increased first gas flow rate of the exhaust device and the increased second gas flow rate of the gas supply device when the measured concentration of the debris is less than a lower threshold value.

19. The method as claimed in claim 16, further comprising:

providing a second control signal to an EUV scanner when the measured concentration of the debris exceeds an upper threshold value, wherein in response to the second control signal, the EUV scanner provides the first control signal after completing the lithography exposure process.

20. The method as claimed in claim 19, further comprising:

notifying the EUV scanner to perform a next lithography exposure process when the measured concentration of the debris is less than a lower threshold value during the purge operation.

* * * * *